(12) United States Patent
Wagner et al.

(10) Patent No.: US 7,112,772 B2
(45) Date of Patent: Sep. 26, 2006

(54) CATADIOPTRIC PROJECTION OBJECTIVE WITH ADAPTIVE MIRROR AND PROJECTION EXPOSURE METHOD

(75) Inventors: Cristian Wagner, Aalen (DE); Michael Gerhard, Aalen (DE); Gerald Richter, Abtsgmünd (DE)

(73) Assignee: Carl Zeiss SMT AG, Oberkochen (DE)

( * ) Notice: Subject to any disclaimer, the term of this patent is extended or adjusted under 35 U.S.C. 154(b) by 195 days.

(21) Appl. No.: 10/759,964

(22) Filed: Jan. 17, 2004

(65) Prior Publication Data

US 2004/0144915 A1 Jul. 29, 2004

Related U.S. Application Data

(63) Continuation-in-part of application No. 09/321,908, filed on May 28, 1999.

(30) Foreign Application Priority Data

May 29, 1998 (DE) ................. 198 24 030

(51) Int. Cl.
*G01J 1/20* (2006.01)
(52) U.S. Cl. .................... 250/201.9; 359/849
(58) Field of Classification Search ............. 250/201.1, 250/201.9, 216, 548; 359/846–849, 291, 359/224

See application file for complete search history.

(56) References Cited

U.S. PATENT DOCUMENTS

| | | | |
|---|---|---|---|
| 3,893,755 A | 7/1975 | Cobarg et al. ............. 359/847 |
| 4,043,644 A * | 8/1977 | Humphrey ................. 359/846 |
| 4,119,366 A | 10/1978 | Lemaitre .................... 359/847 |
| 4,393,303 A * | 7/1983 | Spinhirne ................. 250/201.9 |
| 4,461,398 A | 7/1984 | Argy .................... 220/560.06 |
| 4,647,164 A | 3/1987 | Sawicki et al. ............. 359/849 |
| 4,655,563 A | 4/1987 | Plante et al. ................ 359/849 |
| 4,993,823 A * | 2/1991 | Schaffer et al. ............ 359/849 |
| 5,052,763 A | 10/1991 | Singh et al. ................ 359/355 |
| 5,089,915 A | 2/1992 | Gobeli ....................... 359/846 |
| 5,142,132 A | 8/1992 | MacDonald et al. ..... 250/201.9 |
| 5,793,473 A * | 8/1998 | Koyama et al. .............. 355/55 |
| 5,798,878 A | 8/1998 | Asari et al. ................. 359/846 |
| 5,805,273 A * | 9/1998 | Unno .......................... 355/30 |
| 5,880,891 A | 3/1999 | Furter ........................ 359/651 |
| 5,963,374 A * | 10/1999 | Endou et al. ............... 359/641 |

FOREIGN PATENT DOCUMENTS

| | | |
|---|---|---|
| DE | 196 16 922.4 | 4/1996 |
| EP | 0 744 641 B1 | 9/2001 |
| JP | 08-55789 | 6/1994 |
| WO | 93/22711 | 11/1993 |

* cited by examiner

*Primary Examiner*—Thanh X. Luu
(74) *Attorney, Agent, or Firm*—Fish & Richardson P.C.

(57) ABSTRACT

A catadioptric projection objective for microlithography has at least one curved mirror that is deformable and adjusting elements that can deform the deformable mirror. The adjusting elements are matched to given image errors and their correction. The invention is suitable for astigmatism, fourfold wavefront-deformations due to lens heating, compaction, and the like.

35 Claims, 2 Drawing Sheets

CATADIOPTRIC PROJECTION OBJECTIVE WITH ADAPTIVE MIRROR AND PROJECTION EXPOSURE METHOD

CROSS-REFERENCES TO RELATED APPLICATIONS

This is a Continuation-in-Part of U.S. patent application Ser. No. 09/321,908 filed May 28, 1999 of the same inventors.

STATEMENT REGARDING FEDERALLY SPONSORED RESEARCH OR DEVELOPMENT

Not applicable.

BACKGROUND OF THE INVENTION

1. Field of the Invention

The invention relates to a catadioptric projection objective for microlithography, with at least one curved mirror, and an operating process that increases image quality of such an objective 2. Discussion of Relevant Art U.S. Pat. No. 5,142,132 describes a wafer stepper with an objective of this field and a planar mirror that can be deformed by an x-y array of actuators in order to correct optical errors. As large as possible a number of actuators for respectively a smallest possible portion of the mirror is described as advantageous. The adjustable mirror is driven at a large angle of reflection so that its effects are severely asymmetrical.

Projection objectives for microlithography having elements whose position can be varied (z-drive) or with change of the optical path by change of pressure or of the composition of the filling gas are known in different variants with many kinds of control circuits. Purely refractive objectives are described here as a rule.

European Patent EP 0 660 169 describes a refractive projection objective for microlithography with correction by rotation of cylindrical lenses of errors that are not rotationally symmetrical. Citations relating to longitudinally displaceable lenses are also described.

Catadioptric projection objectives with a curved mirror and a polarization beam splitter are known, e.g. from German Patent DE 196 16 922.4 (U.S. patent application Ser. No. 08/845,384 filed Apr. 15, 1997) and the citations given therein. The content of this patent application is incorporated herein by reference.

Other catadioptric projection objectives are likewise known, e.g., those of the type of the modified Schupman achromats, also termed H-design, and described, e.g., in U.S. Pat. No. 5,052,763.

SUMMARY OF THE INVENTION

The invention has as its object the provision of a catadioptric reduction objective that with the simplest construction nevertheless permits an effective control and regulation of the imaging quality, particularly as regards variable disturbances. A further object of the invention is corresponding operating methods for a projection exposure device.

This object is attained by a catadioptric projection objective having at least one curved mirror that is deformable and adjusting elements that deform the curved mirror, in which the adjusting elements are matched to given image errors and their correction.

The adjustment of a curved mirror, which is already effectively in the basic position for image formation, is common to all the embodiments, with few actuators, which are appropriately arranged for the required deformation of the mirror.

The number of components and the assembly and control costs are considerably reduced, and the required shape corrections can be set more correctly to shape than with an unspecific actuator array.

The operating process according to the invention solves the object of providing a corresponding process, and puts in concrete terms at most eight contact places (that is, four for zones C; up to four for zones B) of the adjustment device.

The operating process describes the preferably sensed and corrected image errors, wherein the measurement is provided in the region of the image plane, during the exposure or alternating with it.

The sensing of the operating parameters of the projection exposure device or of the properties of the mask, is provided as a parameter for control of the deformation. The associated shape settings can be established in construction, or in the calibration of the system.

Further, lenses, mask and/or wafer may be displaced in order to improve imaging quality.

The invention is thus primarily concerned with the correction of errors that are not distributed rotationally symmetrically, but also not arbitrarily, by means of a mirror deformation which is correspondingly non-rotationally symmetrical. This is just what is expedient for the correction of the non-rotationally symmetrical lens deformations that arise in wafer scanners with a narrow rectangular image field.

BRIEF DESCRIPTION OF THE DRAWINGS

The invention will be described in more detail with reference to the drawings, in which.

DETAILED DESCRIPTION OF THE INVENTION

Figure 1:
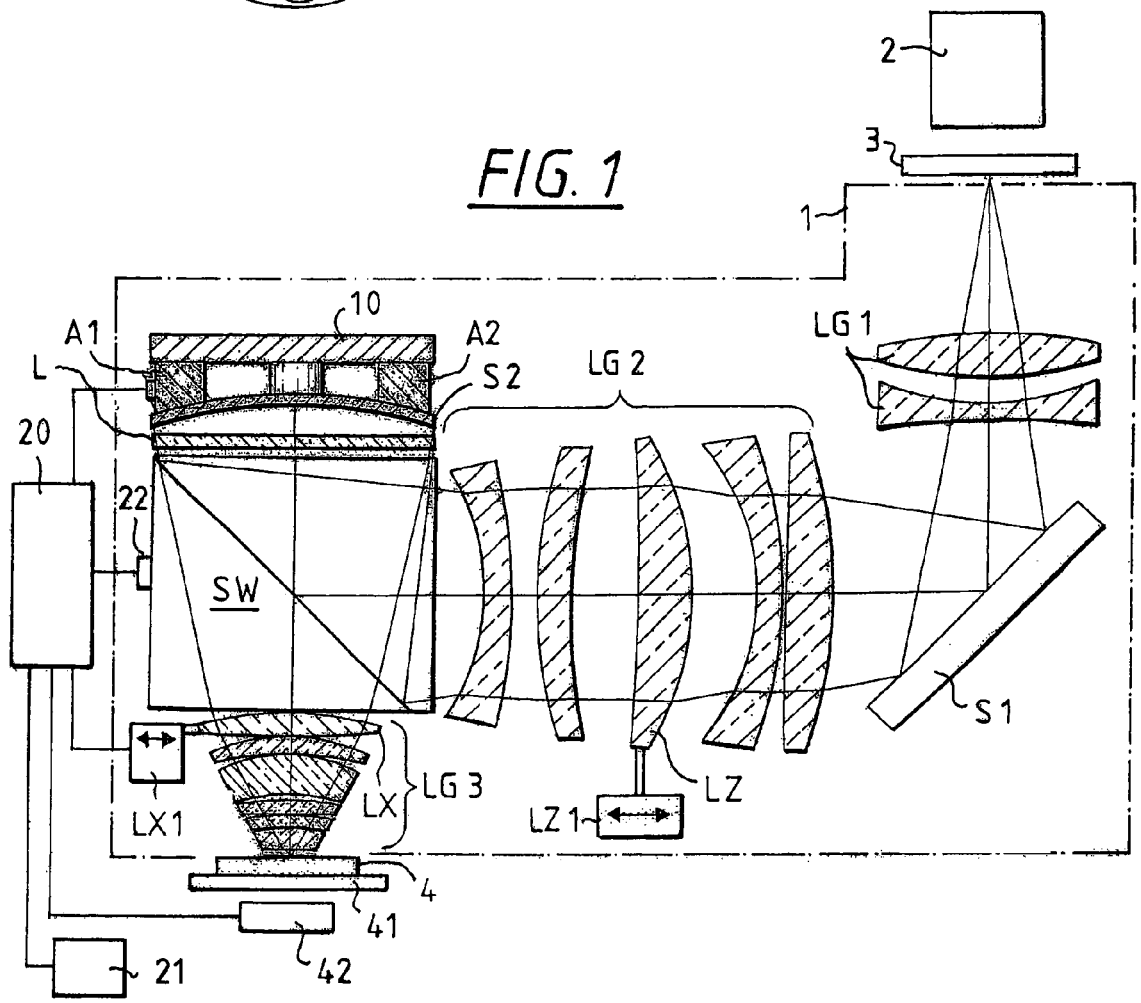
FIG. 1 shows schematically a projection exposure device with catadioptric reduction objective and adaptive mirror.

The core component of the catadioptric projection exposure device according to FIG. 1 is the catadioptric reduction objective 1, in the example shown the embodiment according to FIG. 1 and Table 1 of German Patent Application DE 196 16 922.4 (U.S. patent application Ser. No. 08/845,384), which is incorporated herein by reference.

This catadioptric reduction objective 1 includes a first lens group LG1, a plane deflecting mirror S1, a second lens group LG2, a beam splitter cube SW, a quarter wave plate L, a curved mirror S2 and a third lens group LG3. An illuminating device 2, a mask 3 and a wafer 4 in a holder 41 (wafer chuck) complete the projection exposure device, which is to this extent conventional.

The curved mirror S2 is newly embodied as an adaptive mirror. Actuators A1, A2 and a frame 10 are provided for this purpose. A sensor 42, e.g., a wavefront sensor, is provided in the region of the wafer 4, and measures a parameter for the imaging quality during exposure of the wafer or in pauses when the wafer 4 is removed from the beam path.

A control unit 20, preferably a functional unit of a computer which also undertakes other control tasks of the wafer-stepper or wafer-scanner, uses its signals and possibly those of another sensor 21, for example for air pressure and the temperature of the surroundings, or a sensor 22 for the temperature of the beam splitter prism SW, for driving the actuators A1, A2 and thus for control of the imaging quality.

Axially displaceable lenses, here a lens LZ of a second group LG2, and/or radially displaceable lenses, here a lens LX, are provided and are controlled by the control unit 20 by means of adjusting members LX, LX1. Optionally, at least one lens surface can be finely aspherically processed, and it need not be rotationally symmetrical.

Due to the use of progressively shorter wavelengths in semiconductor lithography, various time-dependent material effects arise that sensitively affect the imaging quality of the exposure optics. The heating of lens groups due to the increased absorption has to be mentioned here, the effect of which is so strong that the resulting image errors, including their variation with time, have to be measured or simulated, and compensated by means of a control loop. It has been found that for wavelengths below 248 nm the absorption increases in dependence on the intensity and duration of irradiation. The increase of absorption (induced absorption) leads to an additional lens heating, which has to be compensated as above. A further effect is a continuous increase of the refractive index, which proceeds with a shrinkage of the material. This effect also is radiation dependent, and is termed "compaction". Here also there is a requirement for a dynamic correction of the image errors, based on a long time scale but however quasi-static. Particularly large image errors arise due to lens heating in a catadioptric design that contains a beam splitter cube SW. According to the present state of the art, an active correction of pupil errors is required for such a design.

An adaptive mirror S2 is therefore disclosed, which is equipped with suitable possibilities of manipulation A1, A2, in order to compensate these image errors, which are dependent on material and process, during the operation of the objective 1 and thus to insure the imaging quality of the objective 1. The adaptive mirror S2 is necessary in order to compensate certain image errors, such as the astigmatism on the axis, when otherwise only spherical centered elements are used.

This can be generalized to all catadioptric designs which contain a mirror which provides an image. For all these systems, particularly with the use of a slit-shaped image field (scanner), the heating of the objective is not rotationally symmetrical, so that an astigmatism arises on the axis.

Altogether, the main image errors that arise due to lens heating and also as a result of "induced" absorption and due to compaction of the beam splitter cube, are (typical values in parentheses):

(a1) astigmatism on the axis (150 nm)
(b1) coma on the axis (20 nm)
(c1) altered focal length (1 μm)
(d1) image field displacement (transverse) (100 nm)
(e1) scale errors (1–5 ppm)
(f1) image shell (50 nm)
(g1) fourfold wavefront-deformation (higher order image error of fourfold symmetry around the optical axis) as a pupil error
(h1) spherical aberration as a pupil error.

These errors reach a stationary state in the course of several hours, and therefore have to be responded to relatively slowly.

Since a scanner system is concerned, the image field is slit-shaped (e.g. 8 mm×25 mm). Strongly elliptical distributions of illumination therefore appear in the lenses (particularly in the lenses of the lens group LG3, near the wafer), and have the following image errors as a consequence:

(a2) astigmatism on the axis
(c2) altered focal length (0.5 μm)
(e2) scale errors (1–5 ppm)
(f2) image shell (100 nm).

The quarter wave plate required for a beam splitter system is placed at a 45° angle to the axes of the scanner slit. Depending on the mounting of the rectangular quarter wave plate, astigmatism in the 45° direction also arises due to bending of the plate.

(a3) 45° astigmatism.

Compensation possibilities are:

For [a1], [g1], [a2], [a3]: Adaptive mirror. For [a1], [a2], and [a3], this must be equipped with at least four actuators Ai (0° and 45° astigmatism). If only the dominant 0° astigmatism is corrected, two actuators Ai are sufficient. The actuators Ai are to be arranged pairwise symmetrically with respect to the optical axis.

[g1] since only a 0° fourfold wavefront-deformation is concerned because of the cube geometry, needs 4 actuators Ai in fourfold rotational symmetry to the optical axis, with collective driving.
  i. Setting region of the actuators: −50 nm to +50 nm
  ii. Resolution and stability: <1 nm.

[b1] is to be compensated with a centering lens (lens LX in this example) with radial mobility.

[c1], [d1], [c2]: Adjustment of the wafer 4 in the axial direction.

[e1], [h1], (e2), [f2]:
  i. displacement of the reticle 3 in the axial direction and z-manipulators LZ1 for displacement of individual lenses LZ or lens groups in the z-direction (axial).

For the measurement of the image errors:

Image field displacement [d1], scale [e1, e2], focus position [c1, c2], astigmatism [a1, a2, a3] and image shell [f1, f2] can be determined in the stepper during operation, e.g., in the manner given in U.S. Pat. No. 5,142,132. Image errors of higher order must be either experimentally determined beforehand or else simulated (FE [finite element] calculations). Care must be taken that in measurements with test interferometers or with wavefront sensors of higher resolution, different operating modes of the objective (NA, σ, reticle transmission) behave differently. The behavior must then be stored in specific look-up tables in the memory of the control unit 20.

Figure 2:
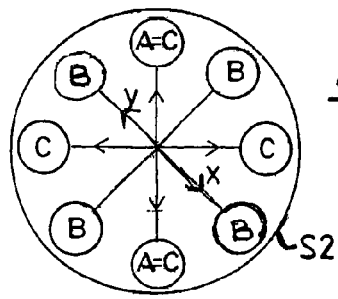
FIG. 2 shows schematically an arrangement of actuators (up to eight contact places—four for zones C and up to four for zones B) and the adaptive mirror.
Figure 3:
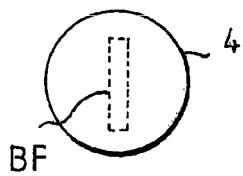
FIG. 3 shows schematically the image field of a wafer scanner.

FIG. 2 shows schematically in a top view of the concave mirror S2. the position of the zones of action (i.e., contact places) of the actuators Ai on the concave mirror S2 in a slit-shaped image field BF corresponding to FIG. 3. With four zones C and four zones B (i.e., at most eight contact places), the positions of the contact places (or zones of action of the actuators for zones B and zones C) are pairwise rotationally symmetric arms located every 45 degrees from the center. Zones C includes two pairs (or four) rotationally symmetric arms (i.e., four zones C with four arms) and zones B can include one pair of rotationally symmetric arms (two zones with two arms) or, as depicted in FIG. 2, can include two pairs of rotationally symmetric arms, i.e. four zones B with four arms.

The four zones B or C, placed in four fold rotational symmetry on the x- and y-axes, are suitable for compensating the fourfold wavefront-deformation. For this purpose, they are driven collectively, and deform the mirror S2, embodied as an elastic diaphragm, with four mutually symmetrical local extrema. The exact positions (radius) of the actuators Ai in the zones B or C, the displacement path, and the shape of the deformed surface, which are affected by its elasticity and the like, is to be matched in the individual objective 1 and the dimensioning of the image field BF. This is realized in the domain of optical design calculations and with finite element calculations.

Figure 4:
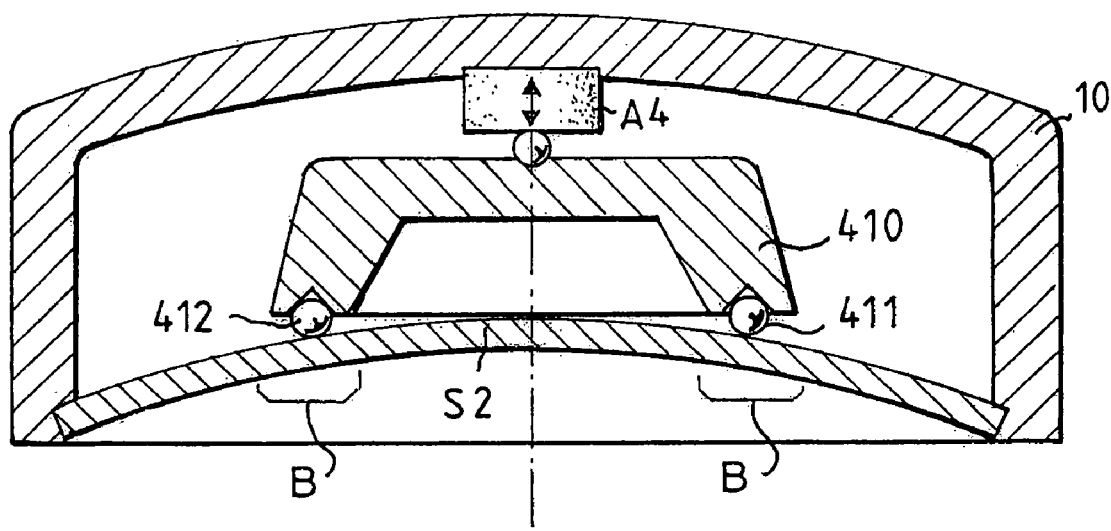
FIG. 4 shows schematically, in cross section, an adaptive mirror with actuator, adjusting member, and several action points.

Since all the four zones B or C are collectively adjusted, it is possible according to FIG. 4 to provide only one actuator A4 which symmetrically deforms the concave mirror S2 in the zones B or C by means of a symmetrical bridge-shaped adjusting element 410, and which is embodied, for example, with presser balls 411, 412 (action places) for precise, moment-free force introduction. With only two arms, the adjusting element 410 could also act on the two zones B. With four arms, the adjusting element could act on four zones B. It should be noted that FIG. 4 depicts two arms schematically, and for simplification, does not depict the arms extending through the plane of the Figure.

The zones A, likewise shown in FIG. 2, coinciding with two of the zones C, serve for the correction of astigmatism at 0° to the y-axis. The two zones B at 45° to the y-axis serve for the correction of astigmatism inclined at 45°. Here also, the actuators Ai are placed pairwise at the zones A or B, and the construction with adjusting elements corresponding to FIG. 4 is possible.

It is also advantageous to exert for astigmatism correction a pressure on the zones A and a tension on the two zones C transverse thereto (or vice versa).

Axial forces can be applied as shown, in the direction of the optical axis of the mirror S2, but also forces perpendicular thereto, intermediate and mixed forms and moments, in the mirror plane perpendicular to the optical axis. The actuators can also engage on the periphery of the mirror.

The solution according to the invention thus exhibits particular simplicity, since a certain few optical errors can be intentionally affected with few independent actuators. A true regulation is thereby possible, and also a purely feed-forward control. The invention can also be applied to overcompensation at an adjustable element, in order to preclude the error action of other elements anywhere in the projection exposure device. Finishing tolerances (scatter between units), lens heating and compaction, and also refractive index changes of the filling gas, etc., can be compensated. For the reduction of the adjustment path, a derivative action can be provided for the active mirror or in other parts of the system.

We claim:

1. A catadioptric projection objective for microlithography comprising:
   at least one curved mirror having an optical axis that is deformable, and
   adjusting elements that deform said curved mirror, in which said adjusting elements comprise at least one actuator, acting collectively upon at least two discrete contact places on said curved mirror that are arranged symmetrically to the optical axis of said curved mirror and with which astigmatism is corrected,
   wherein the projection objective is configured to transmit light from an object at an object plane to an image of the object at an image plane, the image of the object being smaller than the object.

2. The catadioptric projection objective according to claim 1, comprising exactly one curved mirror.

3. The catadioptric projection objective according to claim 1, further comprising an additional adjusting element with an actuator with a bridging part with four contact places on said curved mirror that are arranged in fourfold symmetry to the optical axis of said curved mirror, thus being adapted to the correction of imaging errors of four fold symmetry.

4. The catadioptric projection objective according to claim 1, further comprising:
   at least one sensing a parameter of a projected image, and
   a control system that joins together said at least one sensor and said adjusting elements into a control circuit in which image errors are minimized.

5. The catadioptric projection objective according to claim 4, further comprising:
   at least one second sensor, and
   a control system that joins together said at least one second sensor and said adjusting elements into a control circuit in which image errors are minimized.

6. The catadioptric projection objective according to claim 4, in which said at least one sensor comprises a wavefront sensor.

7. The catadioptric projection objective according to claim 4, in which said at least one sensor comprises at least one of a camera and a CCD camera.

8. The catadioptric projection objective according to claim 1, further comprising a sensor that senses at least one of time, temperature, pressure, an irradiation quantity, a number or light pulses and a number of exposures.

9. The catadioptric projection objective according to claim 1, further comprising at least one optical element that is variable in position.

10. The catadioptric projection objective according to claim 9, in which said position of said at least one optical element is variable axially in the direction of the optical axis of said projection objective.

11. The catadioptric projection objective according to claim 9, in which an optical path through said projection objective is variable.

12. The catadioptric projection objective according to claim 9, in which said position of said at least one optical element is variable transversely of the optical axis of said projection objective.

13. The catadioptric projection objective according to claim 9, in which said position of said at least at least one optical element is variable rotationally around the optical axis of said projection objective.

14. The catadioptric projection objective according to claim 1, in which said adjusting elements have at least one actuator having a form and arrangement that is matched to a form of deformation of said at least one curved mirror.

15. The catadioptric projection objective according to claim 1, in which actuators or adjusting elements actuated by actuators act in at least one of the direction of the optical axis of said projection objective or perpendicularly thereto.

16. A catadioptric projection objective for microlithography, comprising:
   at least one curved mirror that is deformable, which deformability of said curved mirror includes shapes of said curved mirror with at least one of twofold rotational symmetry, fourfold rotational symmetry, and superpositioning of shapes with said symmetries, and
   at least one of actuators and of adjusting elements actuated by actuators for deformation of said curved mirror, the number, shape and position of said actuators or adjusting elements being matched to the shape and symmetry of specific deformations of said curved mirror, wherein the projection objective is configured to transmit light from an object at an object plane to an image of the object at an image plane, the image of the object being smaller than the object.

17. The catadioptric projection objective according to claim 16, in which said curved mirror is rotationally symmetrical in its basic shape and has a gradient in a radial direction that increases monotonically with radius.

18. The catadioptric projection objective according to claim 17, in which said adjusting elements comprise four actuators or action places that superpose on said basic shape a deformation with fourfold rotational symmetry to the optical axis of said projection objective, compensating for a wave front deformation of fourfold rotational symmetry.

19. The catadioptric projection objective according to claim 16, in which actuators or adjusting elements actuated by actuators act in at least one of the direction of the optical axis of said projection objective or perpendicularly thereto.

20. The catadioptric projection objective for microlithography comprising:
  at least one curved mirror that is deformable, and
  adjusting elements that deform said curved mirror, in which said adjusting elements are matched to given image errors and their correction, further comprising six places at which an actuator or adjusting element acts on said curved mirror, four of said places being arranged in fourfold symmetry, actuation of which is synchronized pairwise and a remaining two of said places being arranged in twofold symmetry on an angle bisector between said four of said places,
  wherein the projection objective is configured to transmit light from an object at an object plane to an image of the object at an image plane, the image of the object being smaller than the object.

21. The catadioptric projection objective according to claim 20, in which actuators or adjusting elements actuated by actuators act in a least one of the direction of the optical axis of said projection objective or perpendicularly thereto.

22. An operating process that increases imaging quality of a microlithographic projection exposure device with a catadioptric objective with at least one curved mirror, comprising the step of deforming said curved mirror by actuators or adjusting elements at only two to four pairs of action places with no more than one adjusting element per pair of action places,
  wherein the catadioptric objective is configured to transmit light from an object at an object plane to an image of the object at an image plane, the image of the object being smaller than the object.

23. The operating process according to claim 22, comprising deforming said curved mirror at three pairs of action places.

24. The process according to claim 22, further comprising the steps of during exposure or during a change of wafer or reticle in a lithography apparatus, sensing at least one of image field displacement, scale, focus position, astigmatism and image shell in the region of an image plane, and driving said actuators or adjusting elements in dependence on sensed information.

25. The process according to claim 22, comprising sensing operating parameters of a projection exposure device and driving said actuators or adjusting elements in dependence on said operating parameters.

26. The process according to claim 25, in which said step of sensing operating parameters comprises sensing at least one of the numerical aperture of said catadioptric objective, type and degree of coherence of an illuminating device, and properties of a mask.

27. The process according to claim 26, in which said step of sensing operating parameters comprises sensing the average transmission of said mask.

28. The process according to claim 22, further comprising moving at least one lens of said catadioptric objective.

29. The process according to claim 28, in which said step of moving said at least one lens comprises movement selected from displacing said at least one lens along said optical axis of said the catadioptric objective, rotating said at least one lens around said optical axis and displacing said at least one lens perpendicular to said optical axis.

30. The process according to claim 22, further comprising varying the position of at least one of a mask or a wafer.

31. The process according to claim 22, further comprising deforming said curved mirror to compensate for at least one of the lens heating and compaction.

32. The process according to claim 22, further comprising matching given image errors, in which said adjusting elements are matched at least to one given image error and said given image errors are corrected.

33. A catadioptric projection objective for microlithography comprising:
  at least one curved mirror that is deformable,
  adjusting elements that deform said curved mirror, and
  an additional adjusting element with an actuator with a bridging part with four discrete contact places on said curved mirror that are arranged in fourfold symmetry to the optical axis of said curved mirror, thus being adapted to correct an imaging error of four fold symmetry,
  wherein the projection objective is configured to transmit light from an object at an object plane to an image of the object at an image plane, the image of the object being smaller than the object.

34. A catadioptric projection objective for microlithography comprising:
  at least one curved mirror that is deformable and comprises an optical axis, and
  adjusting elements that deform said curved mirror, in which said adjusting elements comprise at least one actuator with a bridging part with four contact places on said curved mirror, thus being adapted to a correction of imaging errors of four fold symmetry,
  wherein the objective is configured to transmit light from an object at an object plane to an image of the object at an image plane, the image of the object being smaller than the object.

35. A catadioptric projection objective for microlithography comprising:
  at least one curved mirror that is deformable having an optical axis, and
  adjusting elements that deform said curved mirror, in which said adjusting elements comprise at least one actuator, acting collectively upon at least two discrete contact places on said curved mirror that are arranged symmetrically to the optical axis of said curved mirror matching symmetry of an astigmatism and with which said astigmatism is corrected,
  wherein the objective is configured to transmit light from an object at an object plane to an image of the object at an image plane, the image of the object being smaller than the object.

* * * * *